(12) United States Patent
Lee et al.

(10) Patent No.: US 7,678,592 B2
(45) Date of Patent: Mar. 16, 2010

(54) LED HOUSING AND FABRICATION METHOD THEREOF

(75) Inventors: Seon Goo Lee, Kyungki-Do (KR); Bum Joon Jin, Kyungki-Do (KR); Kyung Taeg Han, Kyungki-Do (KR); Chang Wook Kim, Kyungki-Do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 166 days.

(21) Appl. No.: 11/680,847

(22) Filed: Mar. 1, 2007

(65) Prior Publication Data

US 2007/0145387 A1   Jun. 28, 2007

Related U.S. Application Data

(62) Division of application No. 11/325,327, filed on Jan. 5, 2006, now abandoned.

(30) Foreign Application Priority Data

Feb. 17, 2005   (KR) ............................... 2005-13248

(51) Int. Cl.
*H01L 21/00* (2006.01)
(52) U.S. Cl. .................. 438/26; 438/112; 438/122; 257/E21.504
(58) Field of Classification Search .............. 438/26, 438/27, 110–112, 122; 257/E21.504
See application file for complete search history.

(56) References Cited

U.S. PATENT DOCUMENTS 7,119,422 B2   10/2006   Chin

2003/0168720 A1   9/2003   Kamada
2006/0133044 A1 *   6/2006   Kim et al. .................. 361/704

FOREIGN PATENT DOCUMENTS

| JP | 57-104565 U | 6/1982 |
|---|---|---|
| JP | 09-186393 A | 7/1997 |
| JP | 2000-012728 A | 1/2000 |
| JP | 3073195 U | 8/2000 |
| JP | 2002-532880 A | 10/2002 |
| JP | 2003-303936 A | 10/2003 |
| JP | 2003-332634 A | 11/2003 |
| JP | 2004-179430 A | 6/2004 |
| JP | 2004-343059 A | 12/2004 |
| KR | 2000-0035156 | 6/2000 |

* cited by examiner

*Primary Examiner*—M. Wilczewski
*Assistant Examiner*—Toniae M Thomas
(74) *Attorney, Agent, or Firm*—Lowe Hauptman Ham & Berner, LLP

(57) ABSTRACT

In an LED housing, a heat conducting part has a chip mounting area, a heat connecting area opposed to the chip mounting area and a groove formed adjacent to the heat connecting area. An electrical connecting part has a wiring area placed adjacent to the chip mounting area and an external power connecting area led to the wiring area. A housing body is made of molding resin, and integrally holds the heat conducting part and the electrical connecting part while isolating the electrical connecting part from the heat conducting part. The housing body is provided with a recess extended from a portion of the groove of the heat conducting part to a side of the housing body.

20 Claims, 16 Drawing Sheets

LED HOUSING AND FABRICATION METHOD THEREOF

CLAIM OF PRIORITY

This application is a divisional of U.S. application Ser. No. 11/325,327 filed, Jan. 5, 2006, which claims priority from Korean Patent Application No. 2005-13248, filed Feb. 17, 2005, the disclosures of which are hereby incorporated herein by reference in their entirety.

BACKGROUND OF THE INVENTION

1. Field of the Invention

The present invention relates to a Light Emitting Diode (LED) housing, and more particularly, an LED housing having a simple assembly structure, which enables mass production in an easy fashion, and a fabrication method thereof.

2. Description of the Related Art

A Light Emitting Diode (LED) is a semiconductor device that is activated in response to electric current to generate various colors of light. The color of light generated by the LED is mainly determined by chemical components of LED semiconductor. Such LEDs have several merits such as longer lifetime, lower driving voltage, better initial activation characteristics, higher vibration resistance and higher tolerance on repetitive power switching over conventional lighting devices using filaments, and thus demand for them is gradually on the rise.

In particular, some LEDs such as high power LEDs are recently adopted in illumination systems and backlight units for large-sized Liquid Crystal Displays (LCDs). Such high power LEDs are required to have superior thermal radiation performance because these systems or units require larger power.

FIGS. 1 and 2 illustrate a typical high power LED package, in which FIG. 1 is a perspective cross-sectional view of the high power LED, and FIG. 2 is a cross-sectional view of the high power LED mounted on a circuit board.

Referring to FIG. 1 first, an LED package 10 includes a thermal connecting member 14 (so-called heat slug) with an LED chip 12 seated thereon. The thermal connecting member 14 also functions as heat guide means. The LED chip 12 is powered from an external power source (not shown) via a pair of wires 16 and a pair of leads 18. An encapsulant 20 encapsulates the top portion of the thermal connecting member 14 including the LED chip 12, and a lens 22 is capped on the encapsulant 20. A housing 24 is formed typically by molding, surrounding the thermal connecting member 14 to support the thermal connecting member 14 and the leads 18.

The LED package 10 shown in FIG. 1 is mounted on a mother board 30 as a heat sink as shown in FIG. 2 to constitute an LED assembly 40. A heat conductive pad 36 such as solder is interposed between the heat conducting member 14 of the LED package 10 and a metal body 32 of the main board 30 to promote heat conduction between them. In addition, the leads 18 are also stably connected to a circuit pattern 34 of the main board 30 by solder 38.

The LED package 10 and its mounting structure on the main board 30 as shown in FIG. 1 are focused to thermal radiation to efficiently radiate heat to the outside. That is, the LED package 10 is so designed that the thermal connecting member 14 as a heat sink is mounted directly or via the thermal conductive pad 36 on the main board 30 in order to radiate heat absorbed from the LED chip 12 to the outside. Then, a major quantity of heat from the LED chip 12 is conducted through the thermal connecting member 14 to the main board 30 and only a minor quantity of heat is radiated to the air through the surface of the LED package 12 including the housing 24 and the lens 22.

However, this structure is disadvantageously complicated to obstruct the automation of LED package fabrication as well as require a large number of components to be assembled together, thereby burdening manufacture cost.

SUMMARY OF THE INVENTION

The present invention has been made to solve the foregoing problems of the prior art and it is therefore an object of the present invention to provide an LED housing and its fabrication method which can overcome restricted application problems by isolating electrical connecting parts from a heat conducting part.

It is another object of the invention to provide an LED housing, which can be fabricated from a frame having electrical connecting parts and a holder for a heat conducting part in order to simplify process and enhance efficiency, and a fabrication method thereof.

In order to realize the above objects, the invention provides an LED housing comprising: a heat conducting part having a chip mounting area to be mounted with an LED chip, a heat connecting area opposed to the chip mounting area and a groove formed adjacent to the heat connecting area; an electrical connecting part having a wiring area placed adjacent to the chip mounting area of the heat conducting part and an external power connecting area led to the wiring area; and a housing body made of molding resin, and integrally holding the heat conducting part and the electrical connecting part while isolating the electrical connecting part from the heat conducting part, wherein the housing body is provided with a recess extended from a portion of the groove of the heat conducting part to a side of the housing body.

Preferably, the electrical connecting part may comprise a pair of lead to be connected with the LED chip by wires, respectively.

Preferably, the heat conducting part is electrically connected to the LED chip.

Preferably, the chip mounting area has at outer peripheral portion extended in a light emitting direction forming into a reflector.

Preferably, the housing body is configured to expose the chip mounting area and the heat connecting area of the heat conducting part and the wiring area of the electrical connecting part, in which the housing body has a peripheral portion formed around and extended beyond the chip mounting area of the heat conducting part and the wiring area of the electrical connecting part, thereby forming a recess therein.

In the LED housing of the invention, the heat conducting part may further comprise a neck formed along an outer peripheral portion between the chip mounting area and the groove.

The invention also provides a fabrication method of an LED housing, comprising steps of:

(a) preparing a heat conducting part having a chip mounting area, a heat connecting area opposed to the chip mounting area and a groove formed adjacent to the heat connecting area;

(b) machining a sheet metal to prepare a frame having an outer periphery, at least one electrical connecting part and a plurality of holders extended from the outer periphery to the center of the frame and a hole formed in the outer periphery;

(c) inserting distal ends of the holders into the groove and placing a distal end of the electrical connecting part having the wiring area adjacent to the chip mounting area of the heat conducting part to assemble the heat conducting part to the frame;

(d) mounting a resultant structure of the heat conducting part and the frame to a mold;

(e) injecting resin into the mold to form a housing body integrally holding the heat conducting part, the electrical connecting part and the holders, with a portion of the electrical connecting part and the holders being exposed in part, while isolating the heat conducting part from the electrical connecting part; and (f) cutting the electrical connecting part from the frame and separating the holders from the heat conducting part.

Furthermore, the invention provides a fabrication method of LED housings, comprising steps of:

(a) preparing a plurality of heat conducting parts each having a chip mounting area, a heat connecting area opposed to the chip mounting area and a groove formed adjacent to the heat connecting area;

(b) machining a sheet metal to prepare a frame array sheet each having an outer periphery, at least one electrical connecting part and a plurality of holders extended from the outer periphery to the center of the frame and a hole formed in the outer periphery;

(c) inserting distal ends of the holders into the groove and placing a distal end of the electrical connecting part having the wiring area adjacent to the chip mounting area of the heat conducting part to assemble the heat conducting part to the frame;

(d) mounting a resultant structure of the heat conducting parts and the frame sheet array to a mold;

(e) injecting resin into the mold to form a plurality of housing bodies each integrally holding the heat conducting part, the electrical connecting part and the holders, with a portion of the electrical connecting part and the holders being exposed in part, while isolating the heat conducting part from the electrical connecting part; and (f) cutting the electrical connecting parts from the frame array sheet and separating the holders from the heat conducting parts.

In the above fabrication methods, the machining step (b) may comprise punching, wherein the electrical connecting part may be bent.

In the above fabrication methods, the machining step (b) comprises bending the holders, and the method further comprising a step of: (g) bending the electrical connecting part after the cutting step (f).

Preferably, the inserting step (c) may comprise arranging the distal ends of the holders opposite to each other and inserting the distal ends into the groove of the heat conducting part.

In the above fabrication methods, the mounting step (d) may comprise using the hole of the frame as a guide hole.

Preferably, the housing body formed in the resin injecting step (e) is configured to expose the chip mounting area and the heat connecting area of the heat conducting part, a side of the distal end of the electrical connecting part and a side of the distal end of the holders adjacent to the heat conducting part.

In the above fabrication methods, the holder separating step (f) may form recesses each extended along bottom portions of the housing body from the groove of the heat conducting part to a side of the housing body.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
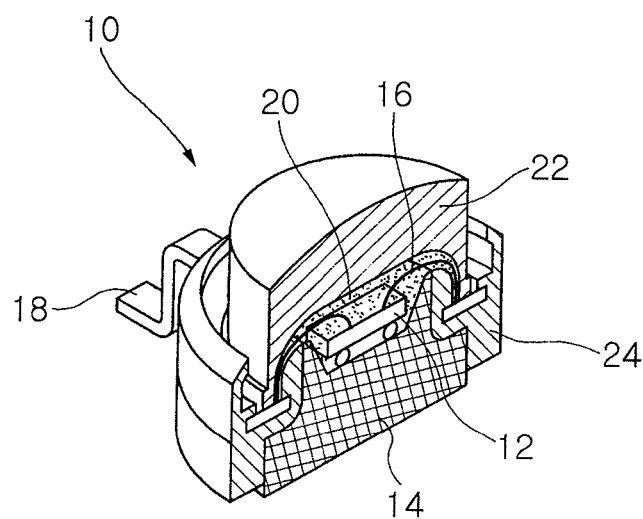
FIG. 1 is a sectional perspective view illustrating a conventional high power LED package.
Figure 2:
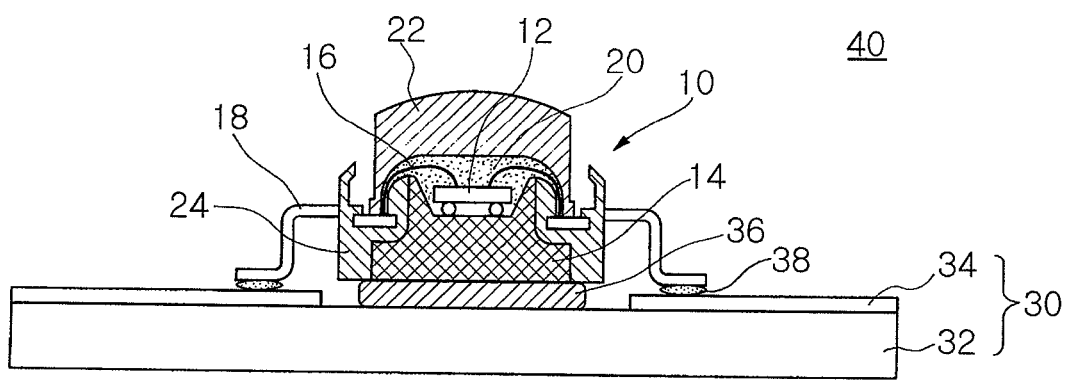
FIG. 2 is a sectional view illustrating the LED package shown in FIG. 1, mounted on a board.
Figure 3:
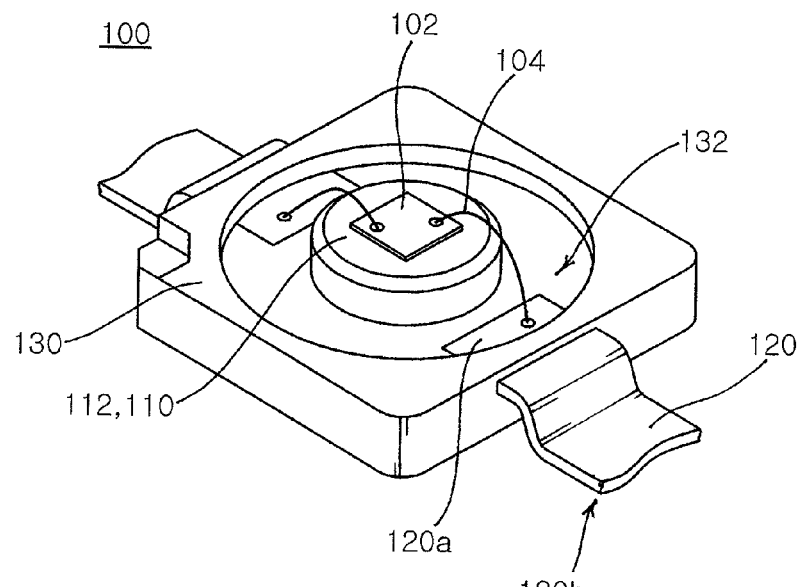
FIG. 3 is a perspective view illustrating a first embodiment of the LED housing according to the invention.
Figure 4:
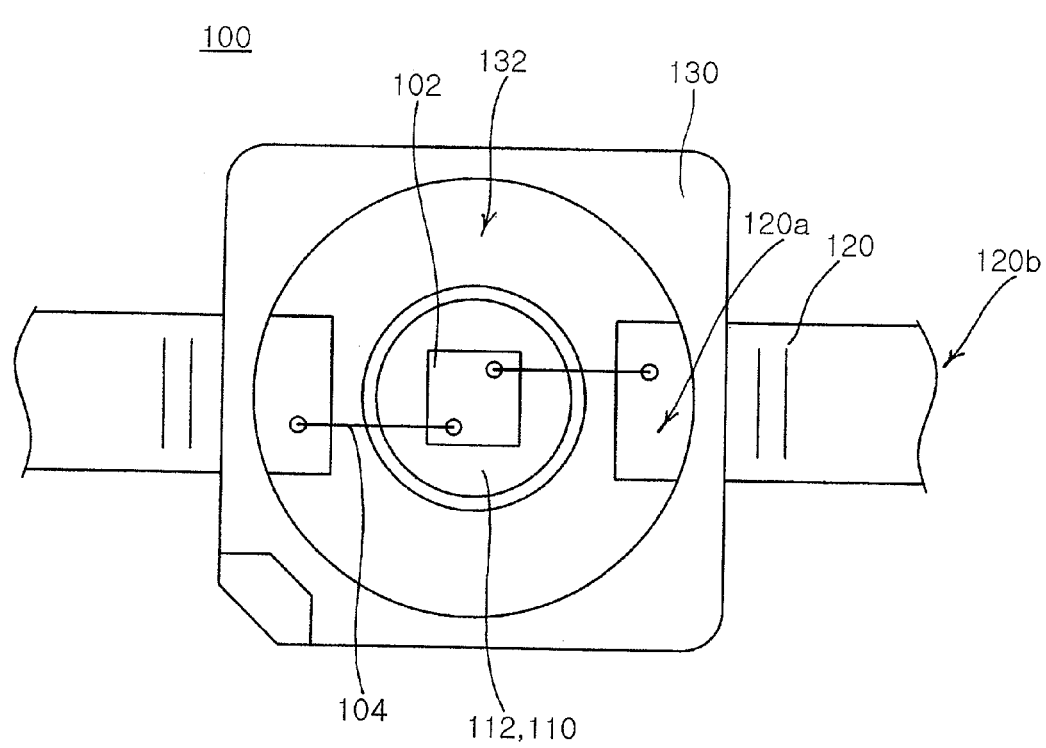
FIG. 4 is a plan view of the LED housing shown in FIG. 3.
Figure 5:
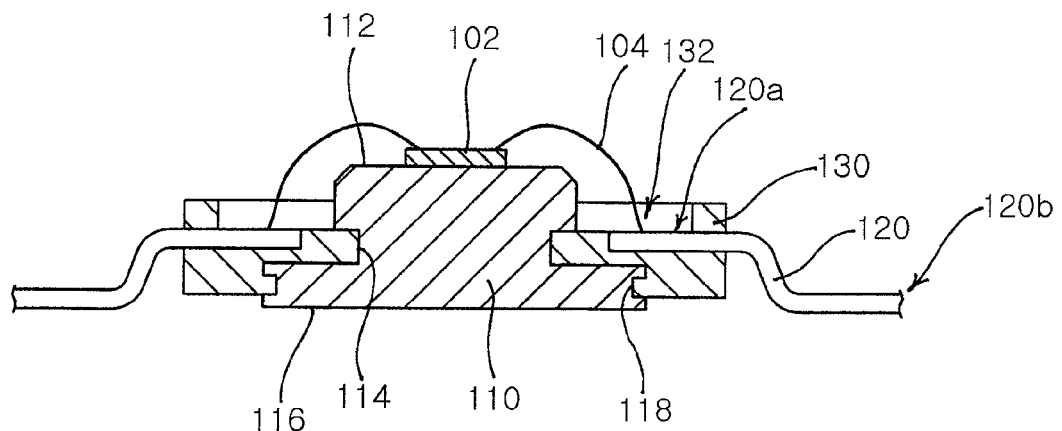
FIG. 5 is a cross-sectional view taken along line V-V in FIG. 4.
Figure 6:
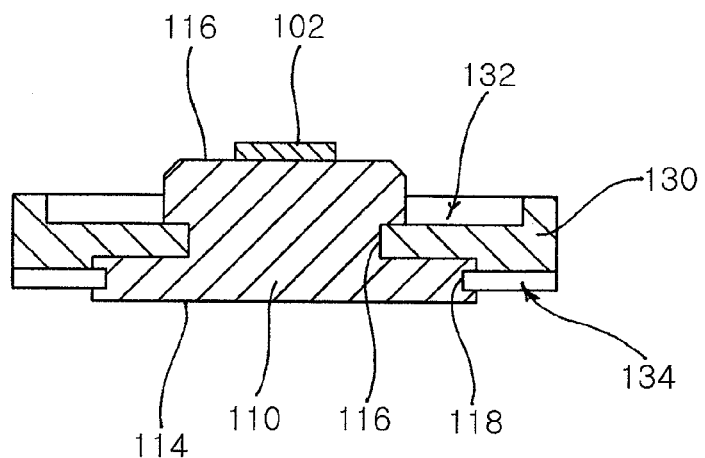
FIG. 6 is a cross-sectional view taken along line VI-VI in FIG. 4.
Figure 7:
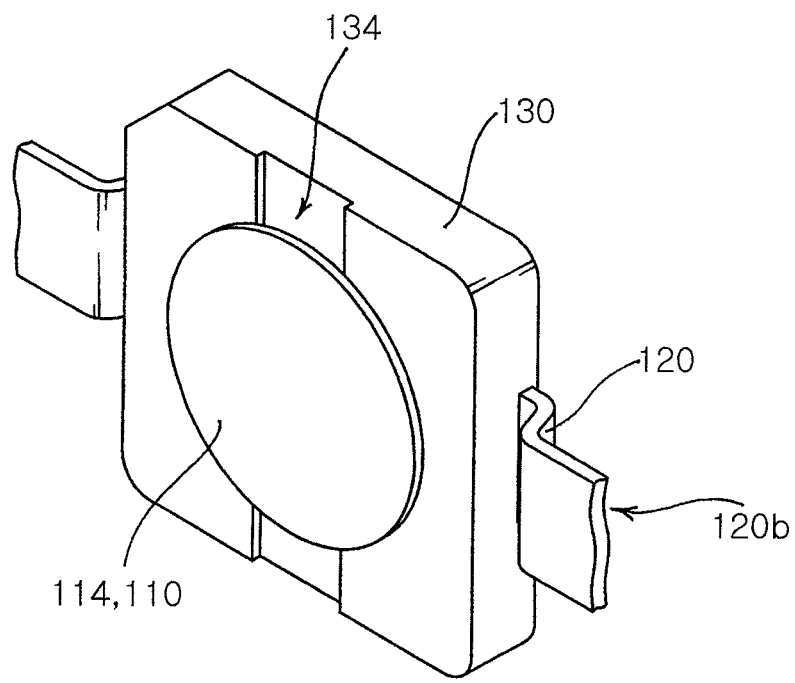
FIG. 7 is a bottom perspective view of the LED housing shown in FIG. 3.

Preferred embodiments of the present invention will now be described in detail with reference to the accompanying drawings.

Referring to FIGS. 3 to 7 first, an LED housing 100 of the invention includes a heat conducting part 110, a pair of electrical connecting parts 120 and a housing body 130.

The heat conducting part 110 is preferably made of a metal piece having high heat conductivity. The heat conducting part 110 has a chip mounting area 112 mounted with an LED chip 102, a heat connecting area 114 opposed to the chip mounting area 112, a groove 118 formed adjacent to the heat connecting area 114 and a neck 116 which is a reduced width portion between the groove 118 and the chip mounting area 112.

Each of the electrical connecting parts 120 is made of a strip-shaped lead in use for electrical connection, and has a wiring area 120a placed adjacent to the chip mounting area 112 of the heat conducting part 110 and an external power connecting area 120b connected to the wire connecting area 120a.

The LED chip 102 is fixed to the chip mounting area 112 by for example adhesive and to the wiring areas 120a of the electrical connecting parts 110 by wires 104.

The housing body 130 is made of molding compound, and formed integrally around the heat conducting part 110 and the electrical connecting parts 120. The housing body 130 isolates the heat conducting part 110 from the electrical connecting parts 120. In addition, a circular opening 132 is provided to expose the chip mounting area 112 of the heat conducting part 110 and the wiring areas 120a of the electrical connecting parts 120.

The housing body 130 partially fills the groove 118 of the heat conducting part 110, and has recesses 134 extended from the groove 118 to sides of the housing body 130 to expose portions of the groove 118. The recesses 134 can receive solders during following process of soldering the LED housing 100 to a board, thereby enhancing the coupling force between the LED housing 100 and the board.

Figure 8:
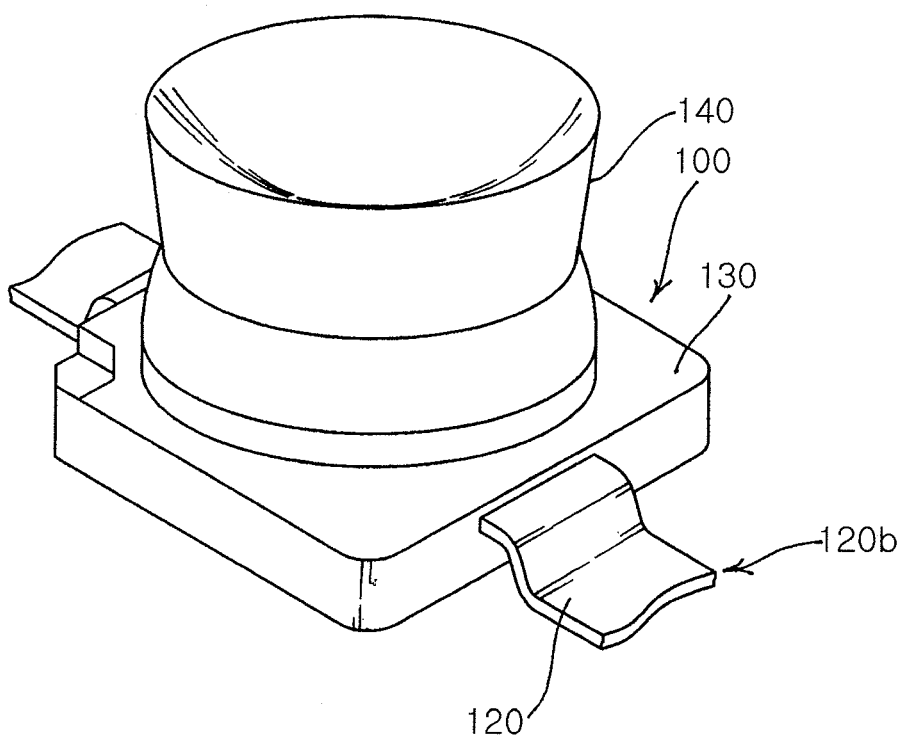
FIG. 8 is a perspective view illustrating an LED housing as shown in FIG. 3, capped with a cover.
Figure 9:
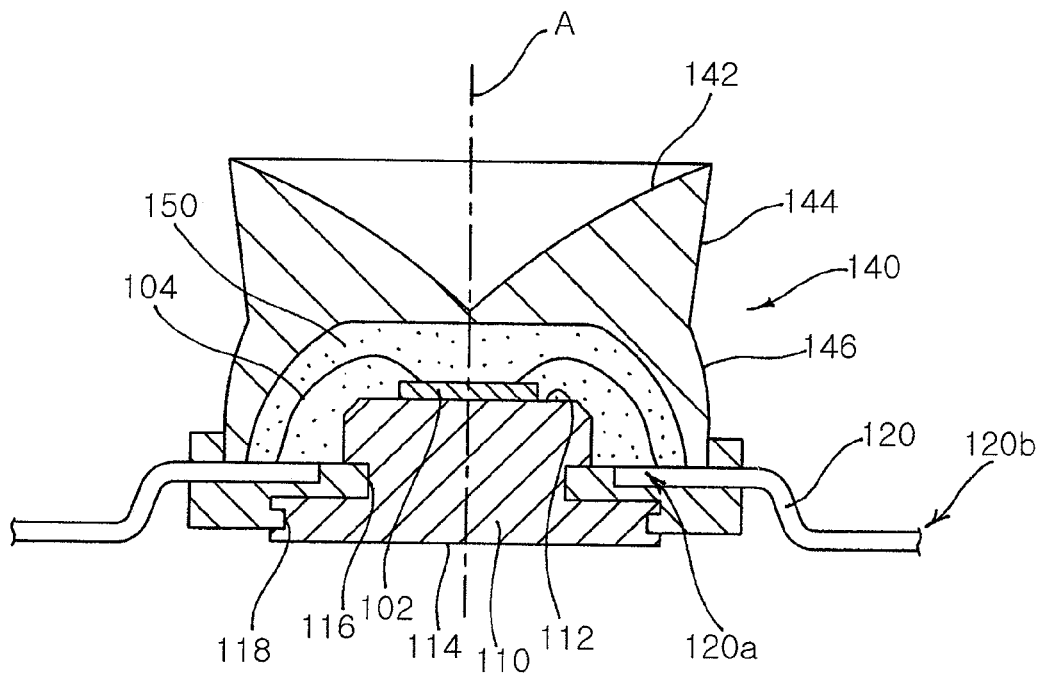
FIG. 9 is a cross-sectional view of the LED housing shown in FIG. 8.

Referring to FIGS. 8 and 9, a transparent cover 140 is capped on the LED housing 100 of the invention to provide an LED package. The cover 140 is made by injection molding of for example transparent plastic, and has a reflecting surface 142 for reflecting light generated by the LED chip 102, an upper radiating surface 144 for radiating reflected light to the outside and a lower radiating surface 146 for radiating light directly incident from the LED chip 102 to the outside. The cover 140 is shaped symmetrically about the axis A or rotationally symmetric.

A transparent encapsulant 150 preferably made of elastic resin is provided between the cover 140 and the LED housing 100. The elastic resin may include gel type substance such as silicone which has not only excellent optical characteristic due to large refractive index but also excellent resistance against yellowing, that is, change in quality caused by single wavelength light. Furthermore, silicone maintains jell or elastomer state even after hardening, and thus can stably protect the LED chip 102 from stress, vibrations and external impact.

Of course, the shape of the cover 140 is illustrative only, but various types of lenses and covers can be used instead. For example, the dome-shaped lens 22 as shown in FIG. 1 can be used. Furthermore, the transparent encapsulant 150 made of elastic material can be optionally omitted.

Figure 10:
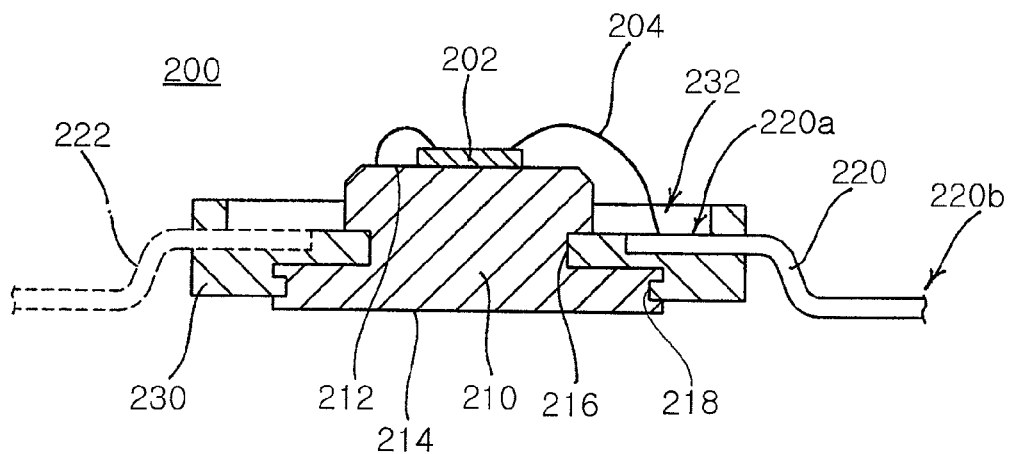
FIG. 10 is a cross-sectional view of a second embodiment of the LED housing according to the invention, shown in cross-section corresponding to FIG. 5.

FIG. 10 shows a second embodiment of the LED housing according to the invention. Examining the LED housing 200 of this embodiment, an LED chip 202 is electrically connected to the electrical connecting part 220 and the heat conducting part 110 by wires 204, respectively. Therefore, the heat conducting part 110 itself functions as an electrical connecting part. Then, a lead 222 designated with dotted line can be omitted. Other construction of the LED housing 200 of this embodiment is substantially the same as that of the LED housing 100 of the first embodiment. Components in the second embodiment that are same as or similar to those of the first embodiment are designated with similar reference signs, with the exception that they are in the 200s rather than in the 100s, and their description will be omitted.

Figure 11:
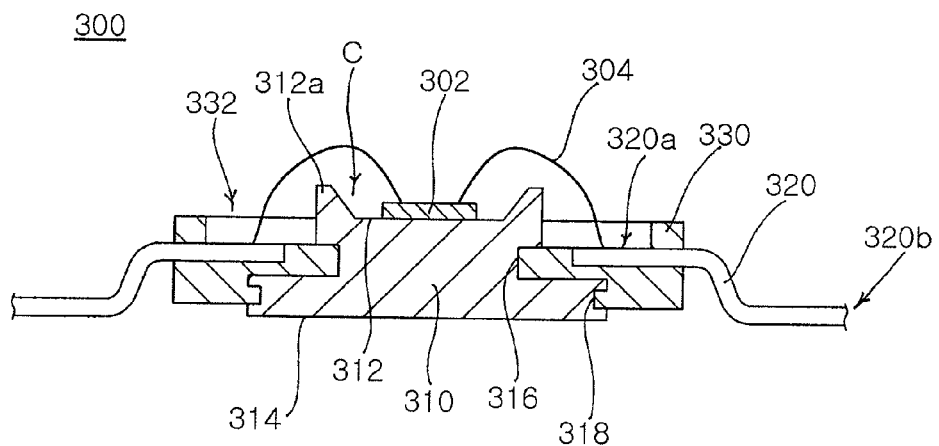
FIG. 11 is a cross-sectional view of a third embodiment of the LED housing according to the invention, shown in cross-section corresponding to FIG. 5.

FIG. 11 shows a third embodiment of the LED housing according to the invention. Examining the LED housing 300 of this embodiment, in a heat conducting part 310, a chip mounting area 312 is protruded at the outer circumference upward to surround an LED chip 302, thereby forming a reflector 312a. The inside of the reflector 312a is shaped as a concave mirror in order to reflect light generated by the LED chip 302 in upward direction. Other construction of the LED housing 300 of this embodiment is substantially the same as that of the above-described LED housing 100. Components in the third embodiment that are same as or similar to those of the first and/or second embodiments are designated with similar reference signs, with the exception that they are in the 300s rather than in the 100s or 200s, and their description will be omitted.

Figure 12:
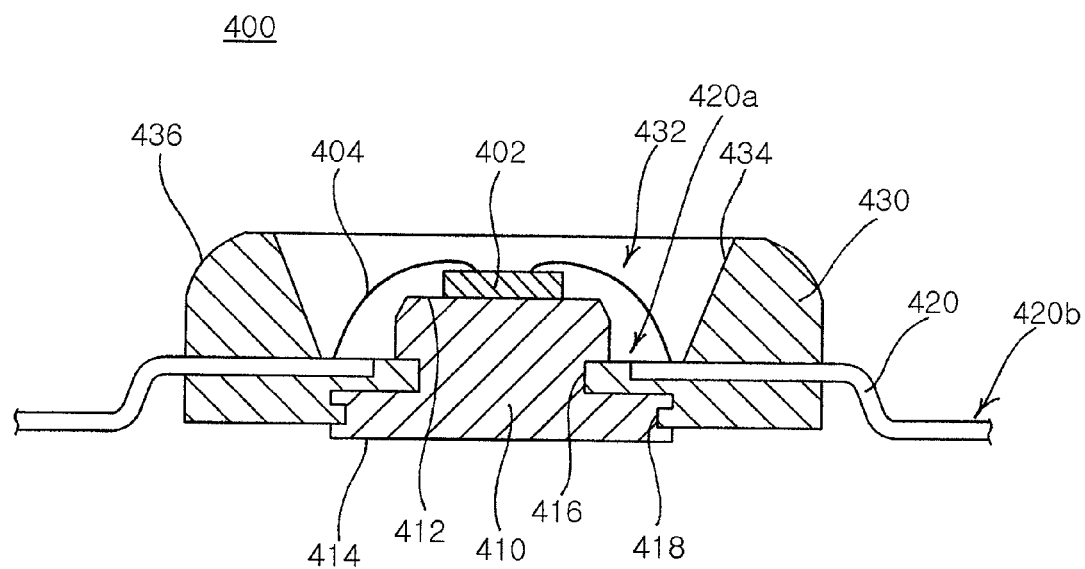
FIG. 12 is a cross-sectional view of a fourth embodiment of the LED housing according to the invention, shown in cross-section corresponding to FIG. 5.

FIG. 12 shows a fourth embodiment of the LED housing according to the invention. Examining the LED housing 400 of this embodiment, a housing body 400 is extended by its outer circumference beyond a chip mounting area 412 of a heat conducting part 410 and an LED chip 402 to form a cavity 432 around them. The housing body 400 has an inside slope formed around the cavity 432 and a curved outside surface 436. Components in the fourth embodiment that are same as or similar to those of the first and/or second and/or third embodiments are designated with similar reference signs, with the exception that they are in the 400s rather than in the 100s or 200s or 300s, and their description will be omitted.

Optionally, the housing body 400 may be made of high reflectivity polymer. In this fashion, it is possible to reflect light generated by the LED chip 402 in upward direction by using the slope 434 as a reflecting surface.

For a polymer of a high reflectivity, NM114WA and NM04WA, which are product names of Otsuka Chemical Co., Ltd. can be used. Specifically, NM114WA has an initial reflectivity of 88.3% and maintains a reflectivity of 78.0% after two hours for a wavelength of 470 nm. NM04WA has an initial reflectivity of 89.0% and maintains a reflectivity of 89.0% after two hours for a wavelength of 470 nm. For an excellent reflectivity molding material, those containing $TiO_2$ are known in the art.

Alternatively, the housing body 400 can be made of metal or polymer of a low reflectivity and high reflectivity material can be provided in the form of a film on the slope 434. This film can be realized using metal of a high reflectivity or the above-described polymer of a high reflectivity.

Figure 13:
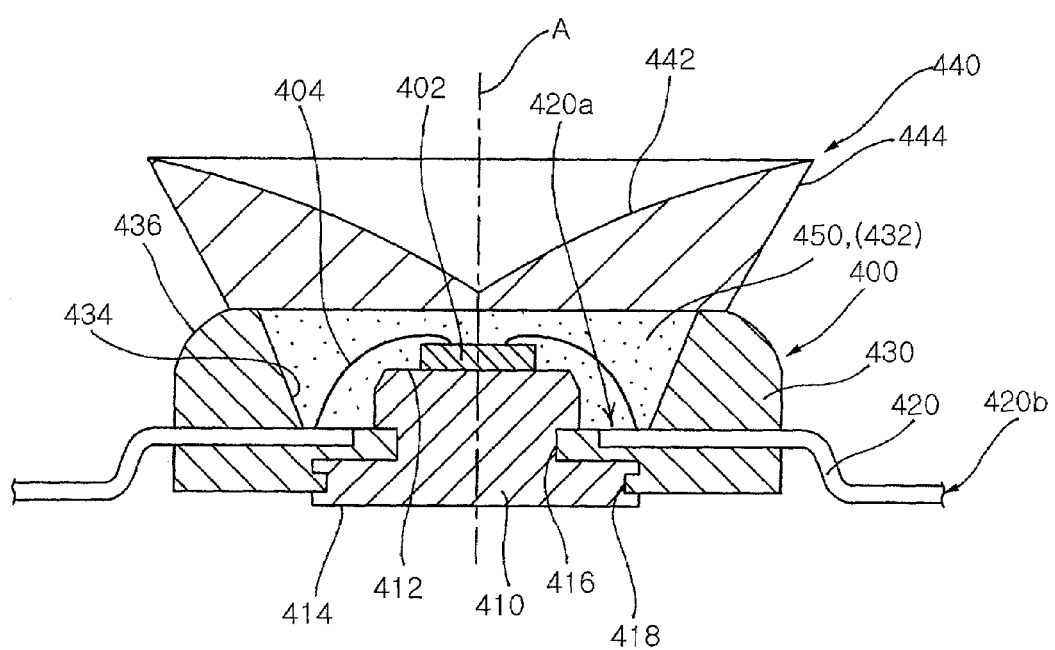
FIG. 13 is a perspective view illustrating an LED housing as shown in FIG. 12, capped with a cover.

FIG. 13 illustrates an LED package embodied by capping a transparent cover 440 on an LED housing 400 as shown in FIG. 12.

In detail, transparent encapsulant 450 made of transparent resin is provided within a cavity 432 of an LED housing 400, and a transparent cover 440 is coupled to the top of the LED housing 400. The transparent encapsulant 450 may be made of epoxy resin, and preferably afore-described elastic resin.

The transparent cover 440 has a reflecting surface 442 and a radiating surface 444 for radiating reflected light to the outside. The cover 440 is shaped symmetrically about the axis A and rotationally symmetric.

The housing body 400 may be made from transparent resin. Then, a curved surface 436 of the housing body 400 functions as a lower radiating surface that radiates light from the LED chip 402 in lateral direction. The light radiation pattern obtained from the LED package is substantially the same as that described above with reference to FIGS. 8 and 9.

Following description will now present a fabrication process of the LED housing 100 of the invention with reference to FIGS. 14 to 22.

Preparing Heat Conducting Part and Frame

Figure 14:
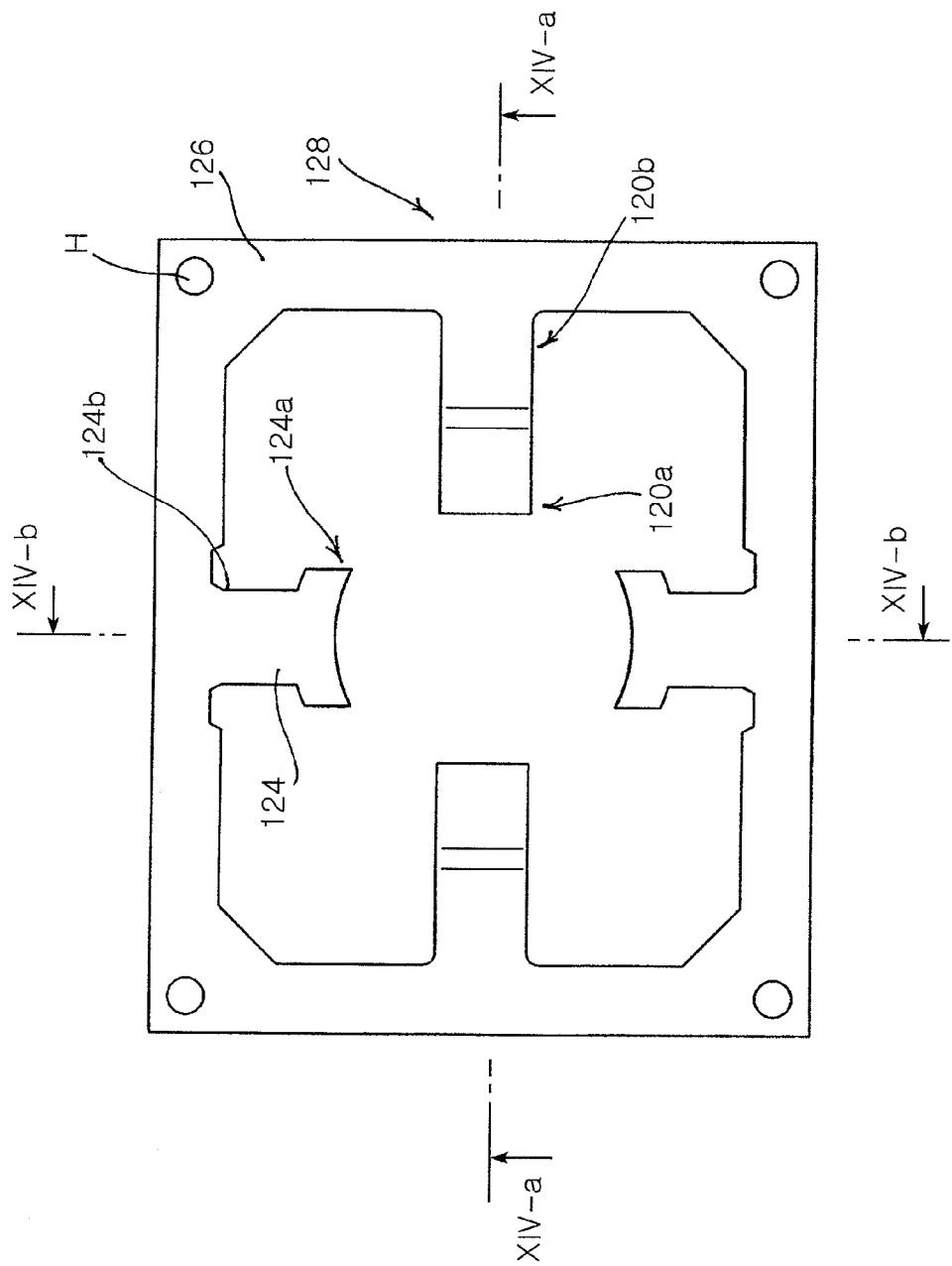
FIGS. 14 to 22 are views illustrating a fabrication process of an LED housing according to the invention in a stepwise manner.
Figure 14A:
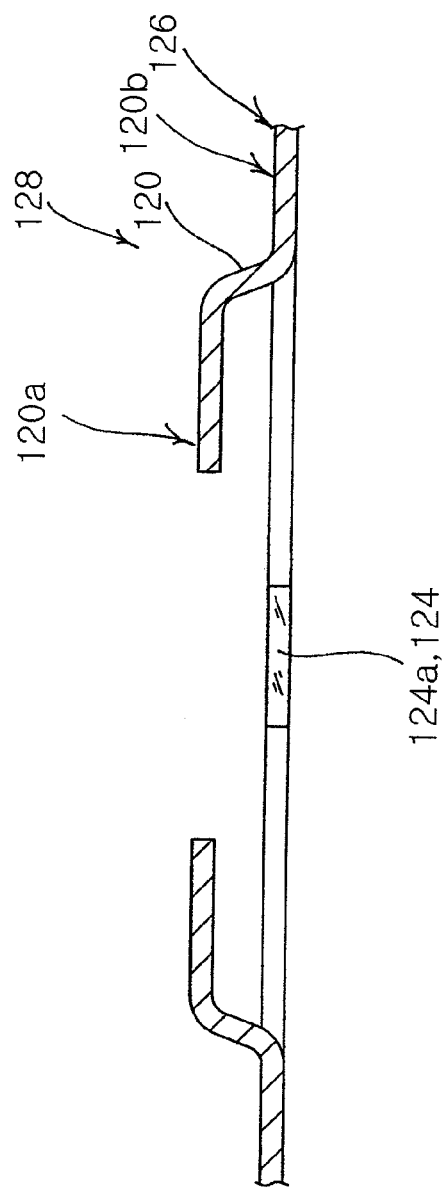
Figure 14B:
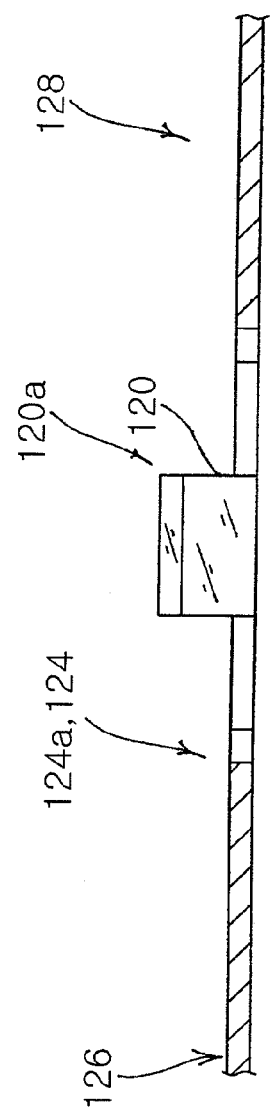

A heat conducting part 110 as described with reference to FIGS. 3 to 7 is prepared from a metal piece and a frame 128 as shown in FIGS. 14, 14a and 14b are prepared from a sheet metal or metal plate preferably by pressing or punching. The frame 128 has a pair of electrical connecting parts 120 and a pair of holders 124 which are extended from an outer circumference 126 to the center. Open areas are formed between the electrical connecting parts 120, the holders 124 and the outer circumference 126.

As shown in FIG. 14a, each electrical connecting part 120 is bent and extended from the frame 128. An external power connecting area 120b is provided at a first end adjacent to the frame 128, and a wire connecting area 120a is provided at a second end opposed to the first end. Alternatively, the electrical connecting part 120 may be extended plat from the frame 128 as designated with dot line in FIG. 16.

A proximal end 124b of each holder 124 is extended flat from the frame 128, and a distal end 124a opposed to the proximal end 124b is inserted into the groove 118 of the heat conducting part 110, acting as a holder for maintaining the heat conducting part 110 in position. The distal end 124a of the holder is shaped matching the recess 118 of the electrical connecting part 110. Alternatively, the holder 124 may be bent and extended from the frame 128, as designated with dot line in FIG. 17.

Besides, holes H are perforated in corners of the frame 128 to locate the frame 128 and maintain its position. Of course, the holes H serve to receive guide pins of a hold (not shown) when the frame 140 is mounted to the mold in following process.

Assembling Heat Conducting Part to Frame

Figure 15:
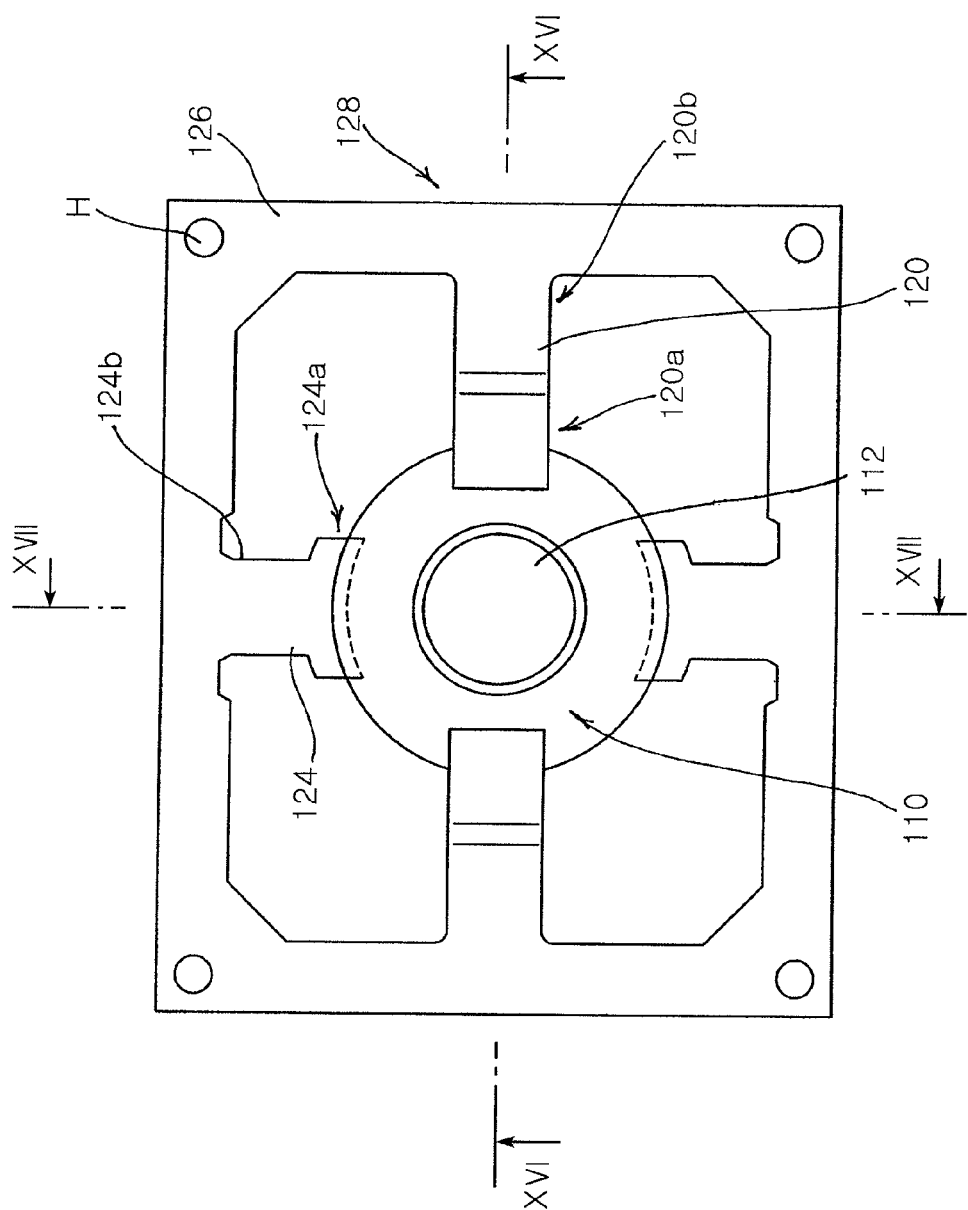
Figure 16:
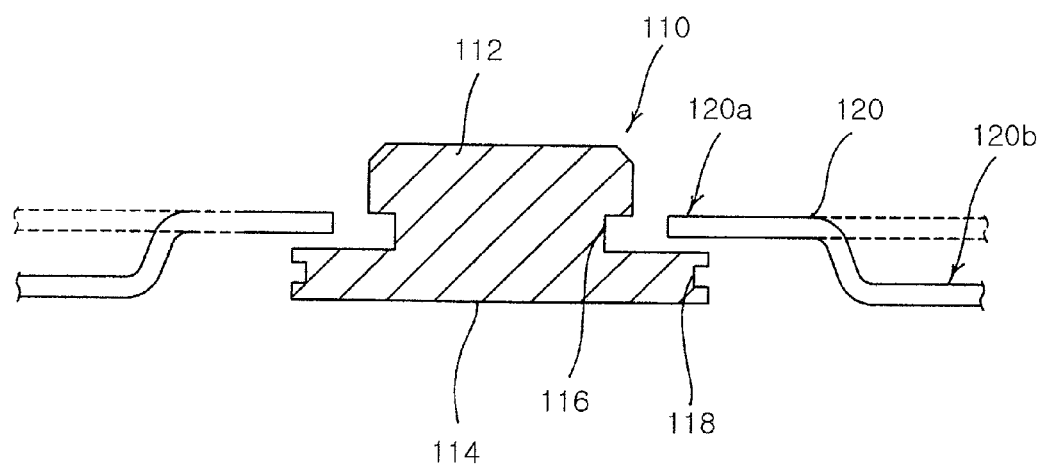
Figure 17:
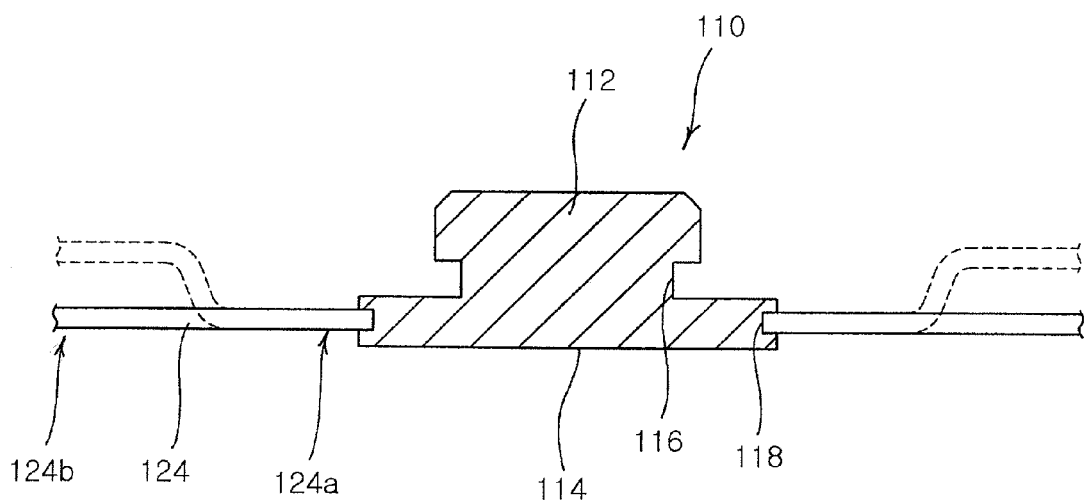
Figure 18:
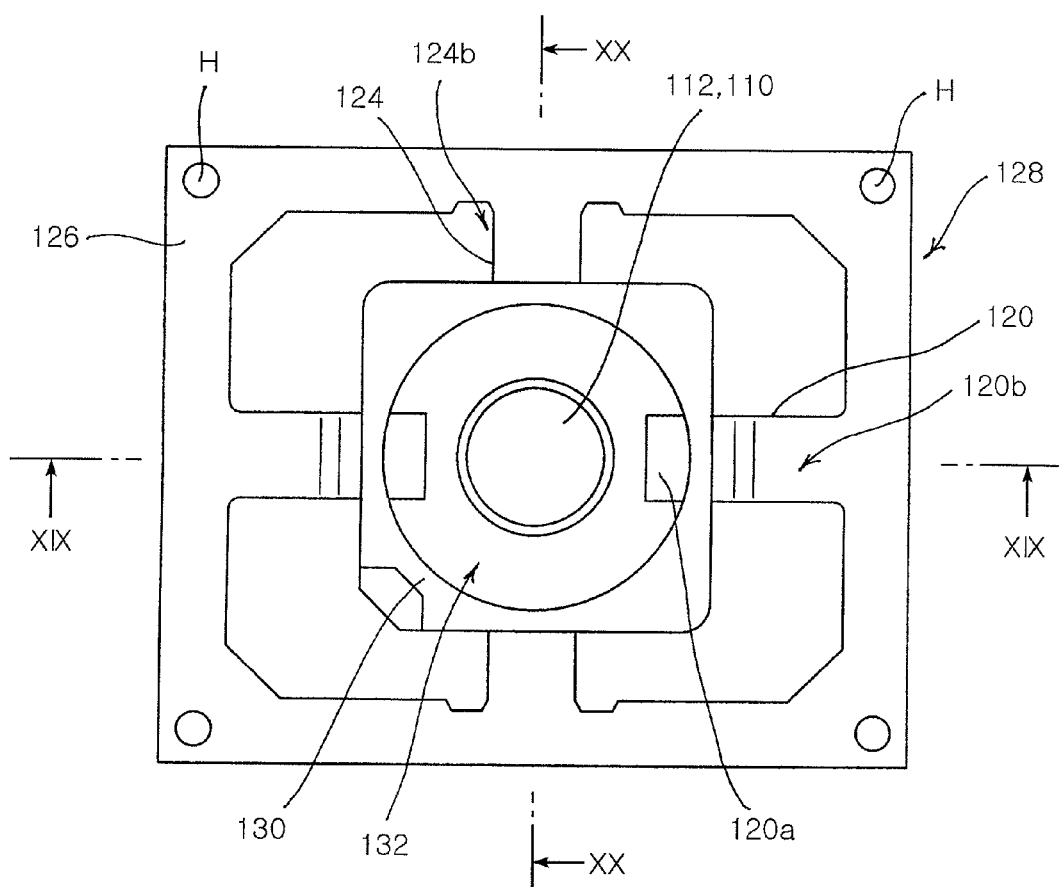
Figure 19:
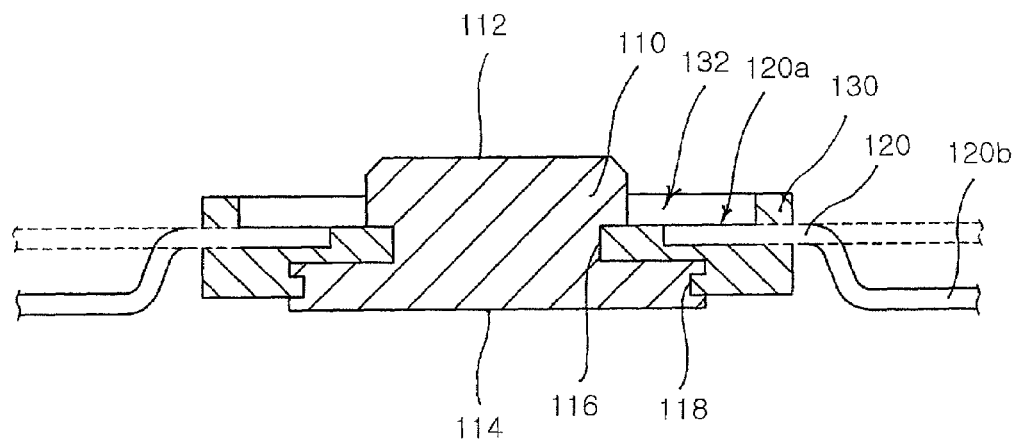
Figure 20:
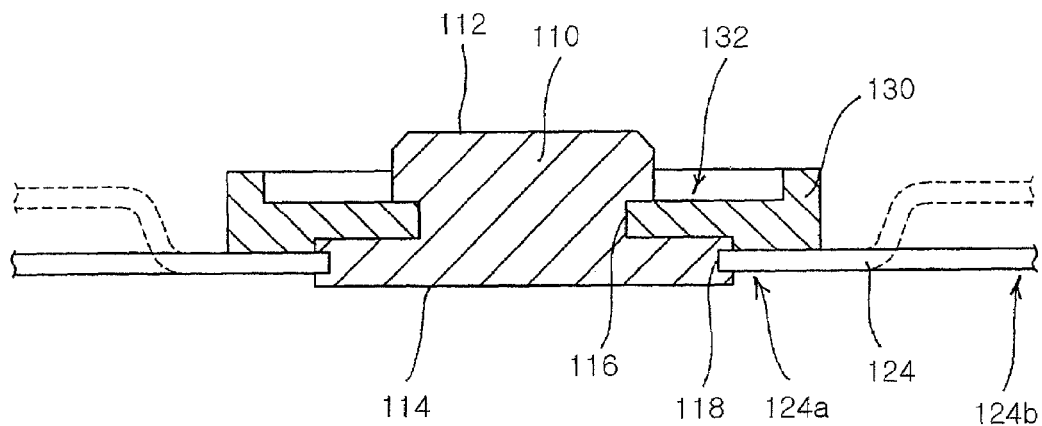
Figure 21:
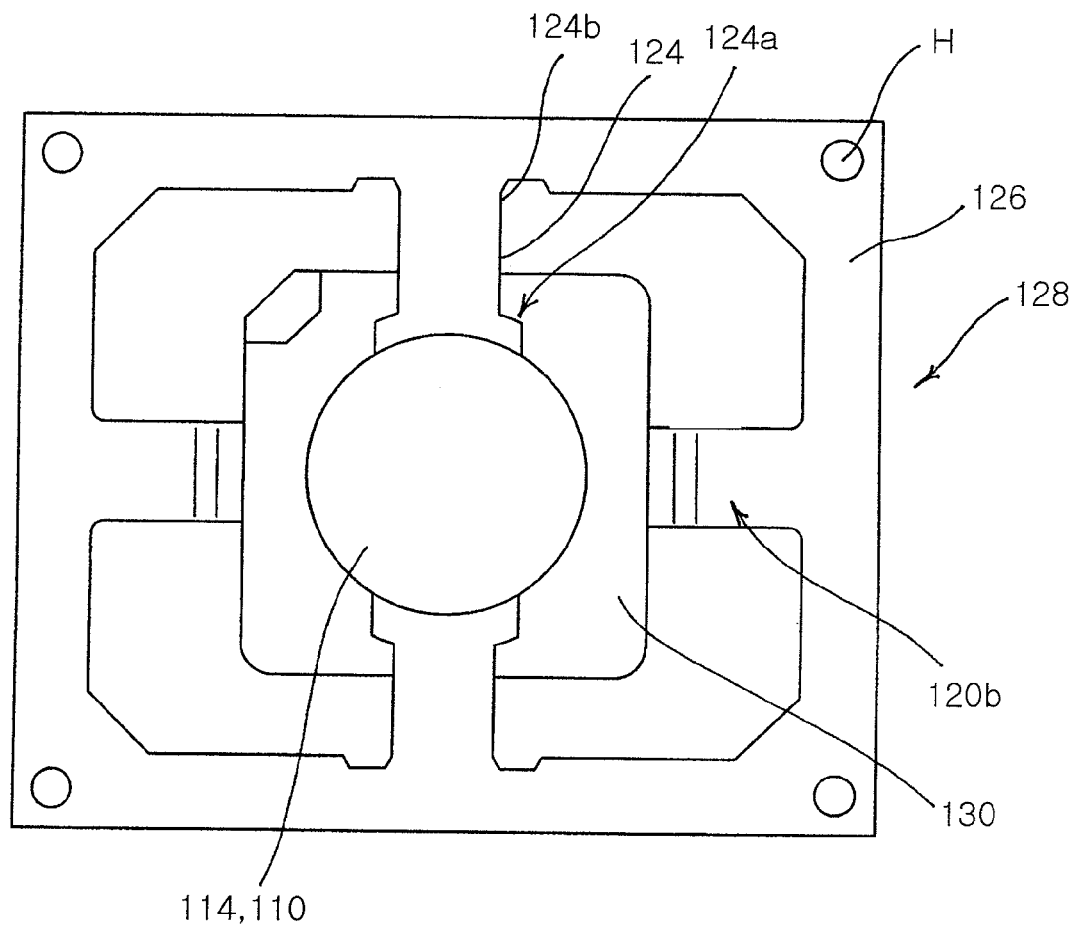

Then, as shown in FIGS. 15 to 17, the heat conducting part 110 is mounted or assembled to the frame 128. To be specific, the distal ends 124a of the holders 124 are inserted into the groove of the heat conducting part and the wiring areas 120a of the electrical connecting part 120 are placed adjacent to the chip mounting areas 112 of the heat conducting part 110, in which the electrical connecting parts 120 maintain a predetermined space from the heat conducting part 110. This makes the holders 120 securely hold the heat conducting part 110 so that the heat conducting part can maintain its position following process of mold mounting and resin injection.

Mold Mounting and Resin Injection

Next the frame 140 assembled with the heat conducting part 110 is mounted to a mold (not shown) by inserting guide pins of mold into the holes H of the frame 128. Then, molding resin is injected into the mold to integrally mold the heat conducting part 110 and parts of the frame 128 adjacent to the heat conducting part 110, thereby forming a housing body 130 having an opening 132 that exposes the chip mounting area 112 of the heat conducting part 110 and the wiring area 120a of the electrical connecting part 120.

Describing in more detail, the housing body 130 integrally holds portions of the electrical connecting parts 120 adjacent to the wiring areas 120a and portions of the holders 124 adjacent to the distal ends 124a. Then, the heat conducting part 110 is held or encapsulated by the housing body 130 except for the chip mounting area 112 and the heat connecting area 114. Besides, the wiring areas 120a of the electrical connecting parts 120 are exposed to the outside, and the external power connecting parts 120b of the electrical connecting parts 120 are projected out of the housing body 130.

Electrical Connecting Part Cutting and Holder Separation

Figure 22:
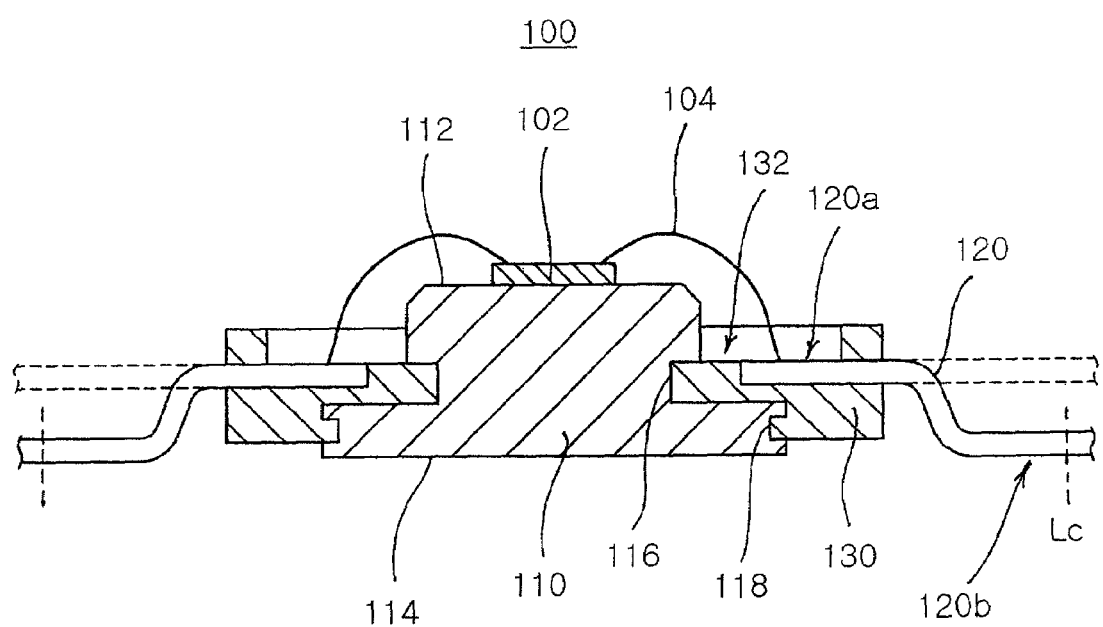

As shown in FIG. 22, the external power connecting areas 120a of the electrical connecting parts 120 are cut along cutting lines Lc from the frame 128, and the holders 124 are withdrawn out of the groove 118 of the heat conducting part 110. Withdrawing the holders 124 leaves recesses 134 (see FIG. 6) in the housing body 130, which in turn act to receive solders in following process of soldering the LED housing 100 to a board (e.g., metal PCB), thereby enforcing the bonding force between the LED housing 100 and the board.

If the electrically connecting parts 120 are flat as shown in dot line, they are bent into the configuration designated with solid line.

Then, an LED chip 102 is attached to the chip mounting area 112 by for example adhesive, and electrically connected to the electrical connecting parts 120 by wires 104.

Mounting Transparent Cover

The LED housing 100 shown in FIG. 22 can be capped with a transparent cover 140 as shown in FIGS. 8 and 9. In this case, the cover 140 is turned upside down, transparent encapsulant 150 of for example silicone is filled into a hollow space of the cover 140, and then the LED housing 100 is turned upside down and placed on the cover 140 with the LED chip 102 facing downward. As the transparent encapsulant 140 is cured from this state, the LED package as shown in FIGS. 8 and 9 can be produced.

Process on Frame Array Sheet

Figure 23:
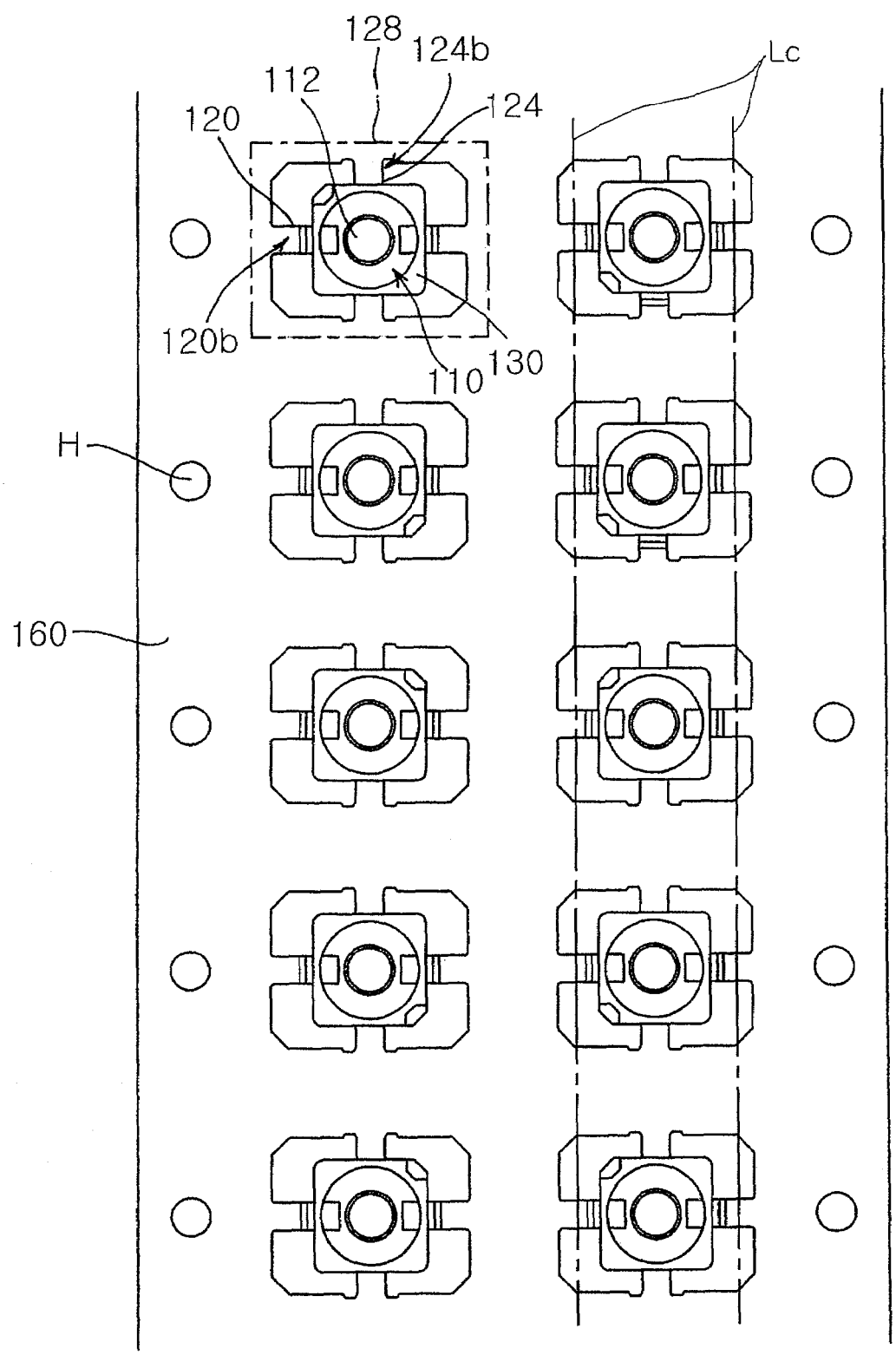
FIG. 23 is a plan view illustrating a fabrication process of LED housings by using a frame array sheet according to the invention.

FIG. 23 shows a frame array sheet 160 having a plurality of frame areas 128' arrayed therein. Each frame area 128' is shaped substantially the same as the afore-described frame 128.

Therefore, the frame array sheet 160 can be used to produce a number of LED housing bodies 130 in the plurality of frame areas 128' according to the same process as described above, in which holes H formed in the periphery of the frame array sheet 160 are used as guide holes or locating holes.

After forming the LED housings 100 according to the above process, the frame array sheet 160 is cut along cutting lines Lc and the holders 124 are withdrawn out of the housing bodies 130 and the recesses of the heat conducting parts 110, so as to accomplish a plurality of LED housings 100.

In this fashion, the above process allows the plurality of LED housings 100 to be automatically produced by using one frame array sheet 160.

The afore-described process fabrication of an LED housing and an LED package having the same LED housing can be applied equally to fabrication of the LED housing 100 of the first embodiment as well as the LED housings 200 and 300 of the second and third embodiments.

In case of the fourth embodiment, this fabrication process is equally applied to fabrication of the LED housing 400, but differs in coupling the cover 440 to the LED housing 400. In the LED housing 400 of the fourth embodiment, transparent encapsulant 450 is filled into the cavity C beforehand as illustrated in FIG. 13, followed by bonding the transparent cover 440 onto the top of the encapsulant 450.

As described above, the LED housing and its fabrication method of the present invention can overcome restricted application problems by isolating the electrical connecting part(s) from the heat conducting part. Furthermore, it is possible to simplify process and enhance efficiency by fabricating the LED housing from a frame having the electrical connecting part(s) and a holder for the heat conducting part.

While the present invention has been shown and described in connection with the preferred embodiments, it will be apparent to those skilled in the art that modifications and variations can be made without departing from the spirit and scope of the invention as defined by the appended claims.

What is claimed is:

1. A method of fabricating a light emitting diode housing, said method comprising the steps of:

preparing a heat conducting part that comprises a chip mounting area, a heat connecting area opposed to the chip mounting area, and a groove formed adjacent to the heat connecting area;

machining a sheet metal to prepare a frame that comprises an outer periphery, at least one electrical connecting part and a plurality of holders extending from the outer periphery toward a center of the frame, and a hole formed in the outer periphery;

inserting distal ends of the holders into the groove, and placing a distal end of the electrical connecting part having a wiring area adjacent to the chip mounting area of the heat conducting part to assemble the heat conducting part to the frame to obtain a resultant structure;

mounting the resultant structure of the heat conducting part and the frame to a mold;

injecting resin into the mold to form a housing body integrally holding the heat conducting part, the electrical connecting part and the holders, with a portion of the electrical connecting part and the holders being partially exposed, while isolating the heat conducting part from the electrical connecting part; and cutting the electrical connecting part from the frame and separating the holders from the heat conducting part;

wherein the machining step comprises bending the electrical connecting part.

2. The fabrication method according to claim 1, wherein the machining step comprises punching.

3. The method according to claim 1, wherein the inserting step comprises arranging the distal ends of the holders opposite to each other and inserting the distal ends into the groove of the heat conducting part.

4. The method according to claim 1, wherein the mounting step comprises using the hole of the frame as a guide hole.

5. The method according to claim 1, wherein the housing body is formed in the resin injecting step to expose the chip mounting area and the heat connecting area of the heat conducting part, a side of the distal end of the electrical connecting part and a side of the distal end of the holders adjacent to the heat conducting part.

6. The method according to claim 1, wherein the holder separating step forms recesses each extending along bottom portions of the housing body from the groove of the heat conducting part to a side of the housing body.

7. A method of fabricating light emitting diode housings, said method comprising the steps of:
preparing a plurality of heat conducting parts each comprising a chip mounting area, a heat connecting area opposed to the chip mounting area, and a groove formed adjacent to the heat connecting area;
machining a sheet metal to prepare a frame away sheet comprising a plurality of frame areas, which are arranged in an array and each of which comprises an outer periphery, at least one electrical connecting part and a plurality of holders extending from the outer periphery toward a center of the frame area, and a hole formed in the outer periphery;
inserting distal ends of the holders of each said frame area into the groove of a respective one of the heat conducting parts wherein a wiring area at a distal end of the electrical connecting part of each said frame area is placed adjacent to the chip mounting area of the respective heat conducting part to assemble the heat conducting parts to the frame array sheet to obtain a resultant structure;
mounting the resultant structure of the heat conducting parts and the frame array sheet to a mold;
injecting resin into the mold to form a plurality of housing bodies each integrally holding the respective heat conducting part, the electrical connecting part and the holders, with a portion of the electrical connecting part and the holders being exposed in part, while isolating the heat conducting part from the electrical connecting part; and
cutting the electrical connecting parts from the frame array sheet and separating the holders from the respective heat conducting parts.

8. The method according to claim 7, wherein the machining step comprises punching.

9. The method according to claim 7, wherein the machining step comprises bending the electrical connecting parts.

10. The method according to claim 7, wherein the machining step comprises bending the holders,
the method further comprising the step of: bending the electrical connecting parts after the cutting step.

11. The method according to claim 7, wherein the inserting step comprises arranging the distal ends of the holders of each said frame area opposite to each other and inserting the distal ends into the groove of the respective heat conducting part.

12. The method according to claim 7, wherein the mounting step comprises using the hole of each said frame area of the frame array sheet as a guide hole.

13. The method according to claim 7, wherein each of the housing bodies is formed in the resin injecting step to expose the chip mounting area and the heat connecting area of the respective heat conducting part, a side of the distal end of the electrical connecting part and a side of the distal end of the holders adjacent to the respective heat conducting part.

14. The method according to claim 7, wherein the holder separating step forms recesses each extending along a bottom portion of each of the housing bodies from the groove of the respective heat conducting part to a side of the housing body.

15. A method of fabricating a light emitting diode housing, said method comprising the steps of:
preparing a heat conducting part that comprises a chip mounting area, a heat connecting area opposed to the chip mounting area, and a groove formed adjacent to the heat connecting area;
machining a sheet metal to prepare a frame that comprises an outer periphery, at least one electrical connecting part and a plurality of holders extending from the outer periphery toward a center of the frame, and a hole formed in the outer periphery, wherein the machining step comprises bending the holders;
inserting distal ends of the holders into the groove, and placing a distal end of the electrical connecting part having a wiring area adjacent to the chip mounting area of the heat conducting part to assemble the heat conducting part to the frame to obtain a resultant structure;
mounting the resultant structure of the heat conducting part and the frame to a mold;
injecting resin into the mold to form a housing body integrally holding the heat conducting part, the electrical connecting part and the holders, with a portion of the electrical connecting part and the holders being partially exposed, while isolating the heat conducting part from the electrical connecting part;
cutting the electrical connecting part from the frame and separating the holders from the heat conducting part; and
bending the electrical connecting part.

16. The fabrication method according to claim 15, wherein the machining step comprises punching.

17. The method according to claim 15, wherein the inserting step comprises arranging the distal ends of the holders opposite to each other and inserting the distal ends into the groove of the heat conducting part.

18. The method according to claim 15, wherein the mounting step comprises using the hole of the frame as a guide hole.

19. The method according to claim 15, wherein the housing body is formed in the resin injecting step to expose the chip mounting area and the heat connecting area of the heat conducting part, a side of the distal end of the electrical connecting part and a side of the distal end of the holders adjacent to the heat conducting part.

20. The method according to claim 15, wherein the holder separating step forms recesses each extending along bottom portions of the housing body from the groove of the heat conducting part to a side of the housing body.

* * * * *